(12) United States Patent
Lee et al.

(10) Patent No.: US 10,714,197 B1
(45) Date of Patent: Jul. 14, 2020

(54) MEMORY DEVICE AND PROGRAM VERIFICATION METHOD THEREOF

(71) Applicant: MACRONIX International Co., Ltd., Hsinchu (TW)

(72) Inventors: Ya-Jui Lee, Taichung (TW); Kuan-Fu Chen, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/388,300

(22) Filed: Apr. 18, 2019

(51) Int. Cl.
*G11C 16/34* (2006.01)
*G06F 11/14* (2006.01)
*G11C 16/26* (2006.01)
*G11C 16/10* (2006.01)
*G11C 16/08* (2006.01)

(52) U.S. Cl.
CPC ...... *G11C 16/3459* (2013.01); *G06F 11/1451* (2013.01); *G11C 16/08* (2013.01); *G11C 16/10* (2013.01); *G11C 16/26* (2013.01)

(58) Field of Classification Search
None
See application file for complete search history.

(56) References Cited

U.S. PATENT DOCUMENTS

2017/0278580 A1* 9/2017 Lim ....................... G11C 16/08

* cited by examiner

*Primary Examiner* — James G Norman
(74) *Attorney, Agent, or Firm* — J.C. Patents

(57) ABSTRACT

A memory device and a program verification method thereof are provided. The write verification method includes: reading a previous page to obtain first read data, writing input data to a current page, reading the previous page or the current page to obtain second read data, and analyzing at least one of the first read data and the second read data to determine whether to back up at least one of the first read data and the input data to a redundant block of the memory device.

18 Claims, 10 Drawing Sheets

(12) United States Patent

MEMORY DEVICE AND PROGRAM VERIFICATION METHOD THEREOF

BACKGROUND OF THE INVENTION

1. Field of the Invention

The invention relates to a memory device and a program verification method thereof, and more particularly, relates to a memory device and a program verification method capable of verifying a word line leakage.

2. Description of Related Art

As process nodes evolve, NAND flash memories face process variation and reliability challenges that impact product performance and yield, and these challenges are especially important in automotive markets with high reliability requirements. In device level size, various solutions have been proposed to reduce process defects such as the word line leakage. Among those solutions, certain word line leakages can be detected at wafer end. However, since a long time high electric field during write and erase processes can lead to the defects, some word line leakages only appear after a program-erase cycle (P/E cycle) and cannot be detected at the wafer end. A solution for the above problem is to detect the word line leakage before erasing, but writing errors may still occur since the word line leakage cannot be completely detected by such solution.

SUMMARY OF THE INVENTION

The invention provides a memory device and a program verification method thereof, which are capable of detecting word line defects during a write verification and quickly backing up the data of the bits with the word line defects, so as to improve quality and reliability of the memory.

A program verification method used by a memory device is provided according to the embodiments of the invention. The program verification method includes, but not limited to, reading a previous page to obtain first read data. Input data is written to a current page. The previous page or the current page is read to obtain second read data. At least one of the first read data and the second read data is analyzed to determine whether to back up at least one of the first read data and the input data to a redundant block of the memory device.

A memory device is provided according to the embodiments of the invention. The memory device includes, but not limited to, a memory array and a controller. The memory array includes a plurality of pages. The controller is coupled to the memory array, the controller being configured as: reading a previous page to obtain first read data; Input data is written to a current page. The previous page or the current page is read to obtain second read data. At least one of the first read data and the second read data is analyzed to determine whether to back up at least one of the first read data and the input data to a redundant block of the memory array.

Based on the above, according to the embodiments of the invention, the memory device and the program verification method thereof can improve quality and reliability of the memory device. By pre-reading the previous page, and reading and analyzing at least one of the previous page and the current page after writing the current page, whether to back up the data to the redundant block of the memory device or not can be determined so that the process defects can be detected in the program verification and a failure rate of the memory device can be also significantly reduced.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
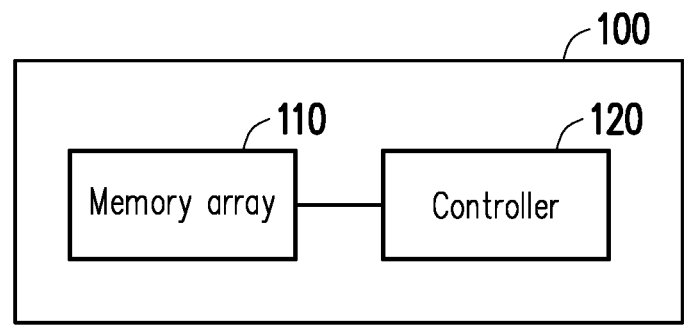
FIG. 1 is a schematic diagram illustrating a memory device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram illustrating a memory device according to an embodiment of the invention. With reference to FIG. 1, a memory device 100 includes a memory array 110 and a controller 120, but not limited thereto. In an embodiment of the present disclosure, the memory array 110 includes a plurality of pages (not illustrated). The pages include, for example, a first page, a second page, . . . , an (N−1)th page, an Nth page etc., each of which is used to store data. However, the invention does not limit the architecture of the memory array. The controller 120 is coupled to the memory array 110, the controller 120 is configured to perform a program verification to the pages. In an embodiment, the memory array 110 further includes redundant blocks (not illustrated), and the redundant blocks can be used to store backup data.

Figure 2:
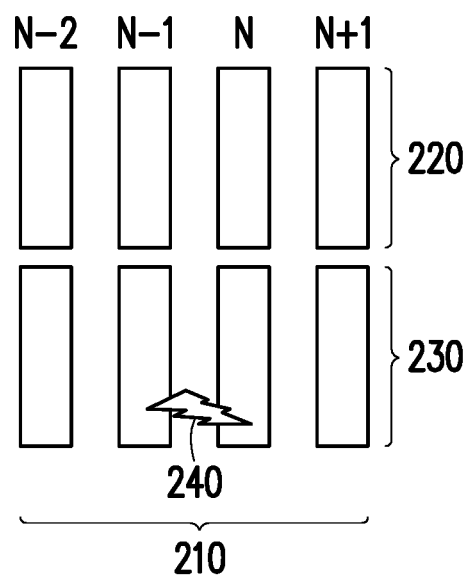
FIG. 2 is a schematic diagram illustrating a word line leakage according to an embodiment of the invention.

FIG. 2 is a schematic diagram illustrating a word line leakage according to an embodiment of the invention. With reference to FIG. 2, a word line 210 includes an (N−2)th word line, an (N−1)th word line, an Nth word line and an (N+1)th word line, but not limited thereto. Here, each word line includes a control gate 220 and a floating gate 230. It should be noted that, in the memory device, defects between the word lines may sometimes occur due to a high electric field during a write operation and cause the word line leakage. For instance, before writing the Nth word line, there is no word line leakage between the (N−1)th word line and the Nth word line. After writing the Nth word line, the defects occur between the floating gate 230 of the (N−1)th word line and the floating gate of the Nth word line due to the high electric field and cause a word line leakage 240. Consequently, errors will occur when reading data from the (N-)th word line and/or the Nth word line. Leakages also possible occur between the control gate 220 of the (N−1)th word line and the control gate of the Nth word line.

Figure 3:
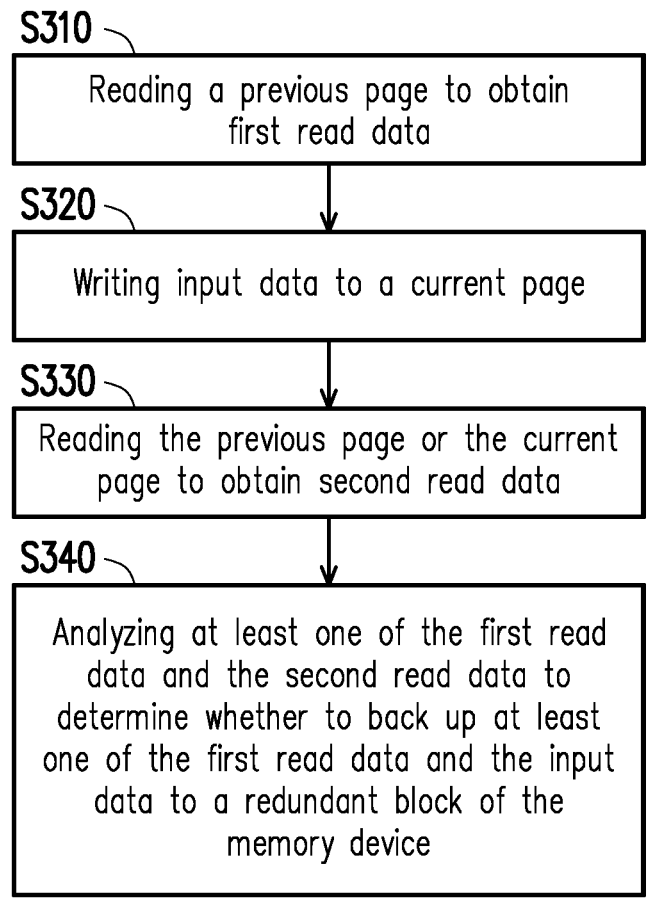
FIG. 3 is a flowchart illustrating a program verification method according to an embodiment of the invention.

FIG. 3 is a flowchart illustrating a program verification method according to an embodiment of the invention. With reference to FIG. 3, in step S310, the controller pre-reads data of a previous page to obtain first read data, wherein the previous page is a previous page of a current page. Next, in step S320, the controller writes input data of the current page to the current page. After writing the current page, in step S330, the controller reads data of the previous page or the current page to obtain second read data. Next, in step S340, the controller analyzes at least one of the first read data and the second read data to determine whether to back up at least one of the first read data and the input data to a redundant block of the memory device.

Figure 4:
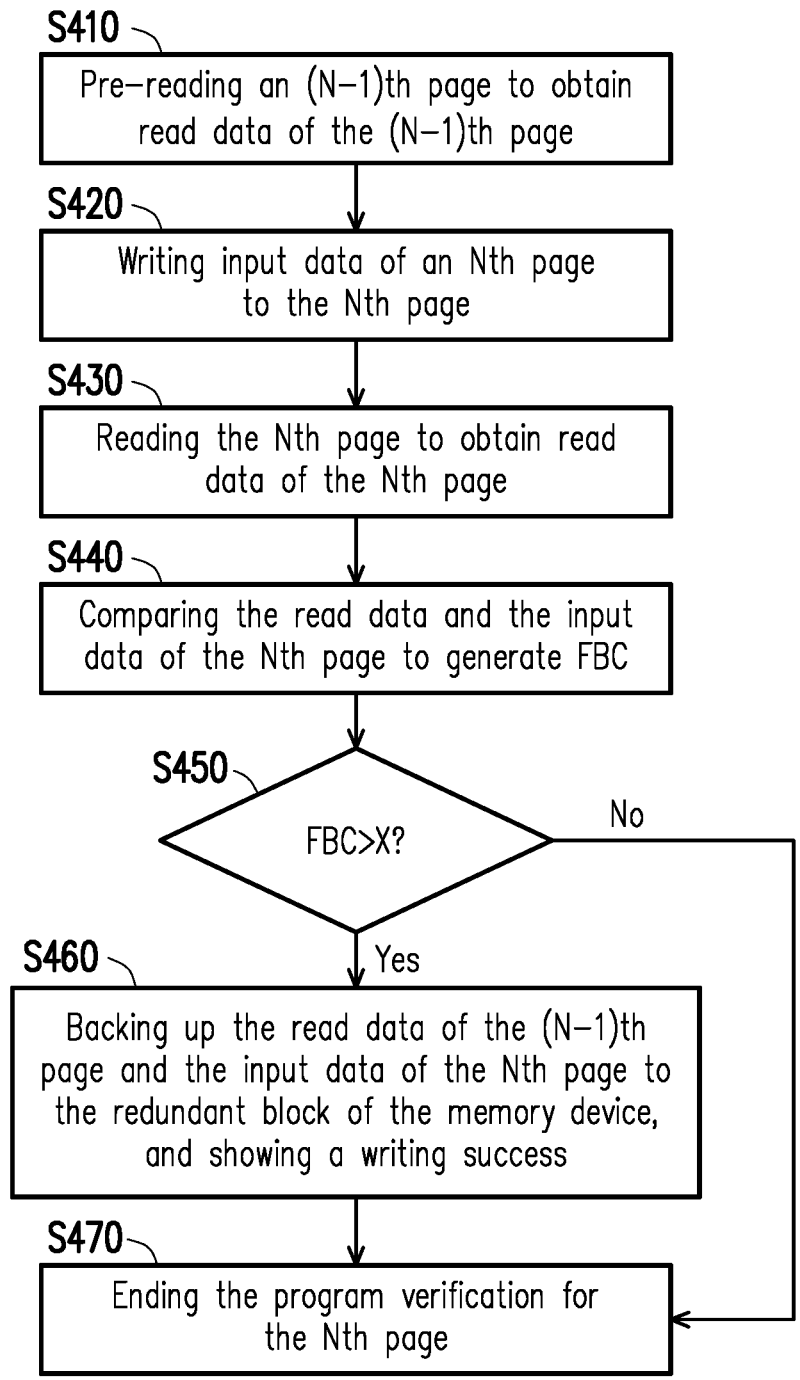
FIG. 4 is a flowchart illustrating a program verification method according to another embodiment of the invention.

FIG. 4 is a flowchart illustrating a program verification method according to another embodiment of the invention. With reference to FIG. 4, before writing an Nth page, in step S410, the controller pre-reads data of an (N−1)th page to obtain read data of the (N−1)th page (i.e., the first read data). Next, in step S420, the controller writes input data of the Nth page to the Nth page. After writing the Nth page, in step S430, the controller reads the Nth page to obtain read data of the Nth page (i.e., the second read data).

In step S440, the controller compares the read data and the input data of the Nth page to generate a failure bit count FBC. Specifically, in an embodiment, the controller can include a counter (not illustrated). The controller determines whether the read data and the input data of the Nth page are equal by comparing the read data and the input data of the Nth page and uses the counter to calculate the failure bit count FBC of the Nth page. For instance, each time when the controller determines that bit data in the read data and the input data of the Nth page are different, the counter adds one to the failure bit count FBC. Each time when the controller determines that the bit data in the read data and the input data of the Nth page are identical, the failure bit count FBC remains unchanged. Accordingly, when data of all bits in the read data and the input data of the Nth page are compared, a verification for the read data of the Nth page is ended and the failure bit count FBC of the Nth page is obtained. It is worth noting that, when the controller determines that the bit data in the read data and the input data of the Nth page are different, it means that a write operation for the Nth page already causes the defects located on the memory cells of the Nth page or between the word lines so that the read data of the Nth page is incorrect.

In step S450, the controller determines whether to back up the read data of the (N−1)th page and the input data of the Nth page to the redundant block of the memory device according to the failure bit count FBC. When the failure bit count FBC is less than or equal to a preset threshold X, the controller does not back up the read data of (N−1)th page and the input data of Nth page and step S470 is executed. When the failure bit count FBC is greater than the preset threshold X, step S460 is executed. Here, the preset threshold X is a preset value based on design requirements, and the invention does not limit a size of the preset threshold X. In step S460, the controller backs up the read data of the (N−1)th page and the input data of the Nth page to the redundant block of the memory device, and a writing success is shown. The present invention does not limit the device or location for showing (or outputting) the writing state. Next, in step S470, the program verification for the Nth page is ended. In this embodiment, the controller compares the input data with the read data of the Nth page to determine whether to back up the data of the (N−1)th page and the Nth page before writing the Nth page.

It should be noted that, when the controller backs up at least one of the read data of the (N−1)th page and the input data of the Nth page to the redundant block, the controller turns on all word lines of the redundant block for performing a one-shot writing with determining whether to verify or not, and it will be based on the backup time which is long or short. Specifically, when backing up the data, since the first read data of the (N−1)th page and the input data of the Nth page are preset to be correct and thus no verification is required, the controller can turn on all the word lines in the redundant block so the input data can be written to the redundant block all at once via bit lines. Accordingly, because the word lines are turned on all at once with determining whether to verify or not, and it will based on the backup time which is long or short, if no program verification, the page only needs about 20 μs extra time for backup, which can reduce program verification time overall.

When reading the (N−1)th page or the Nth page, the controller turns on all word lines of the redundant block for performing a one-shot reading. Specifically, when reading the data, the controller can turn on all the word lines of the redundant block so the data can be read from the bit lines of the redundant block all at once. Since the word lines are turned on all at once, the page only needs about 25 μs more time for reading. The program verification for the entire page only requires extra 60 to 80 μs time based on design requirements, so the program verification time can be reduced overall.

Figure 5:
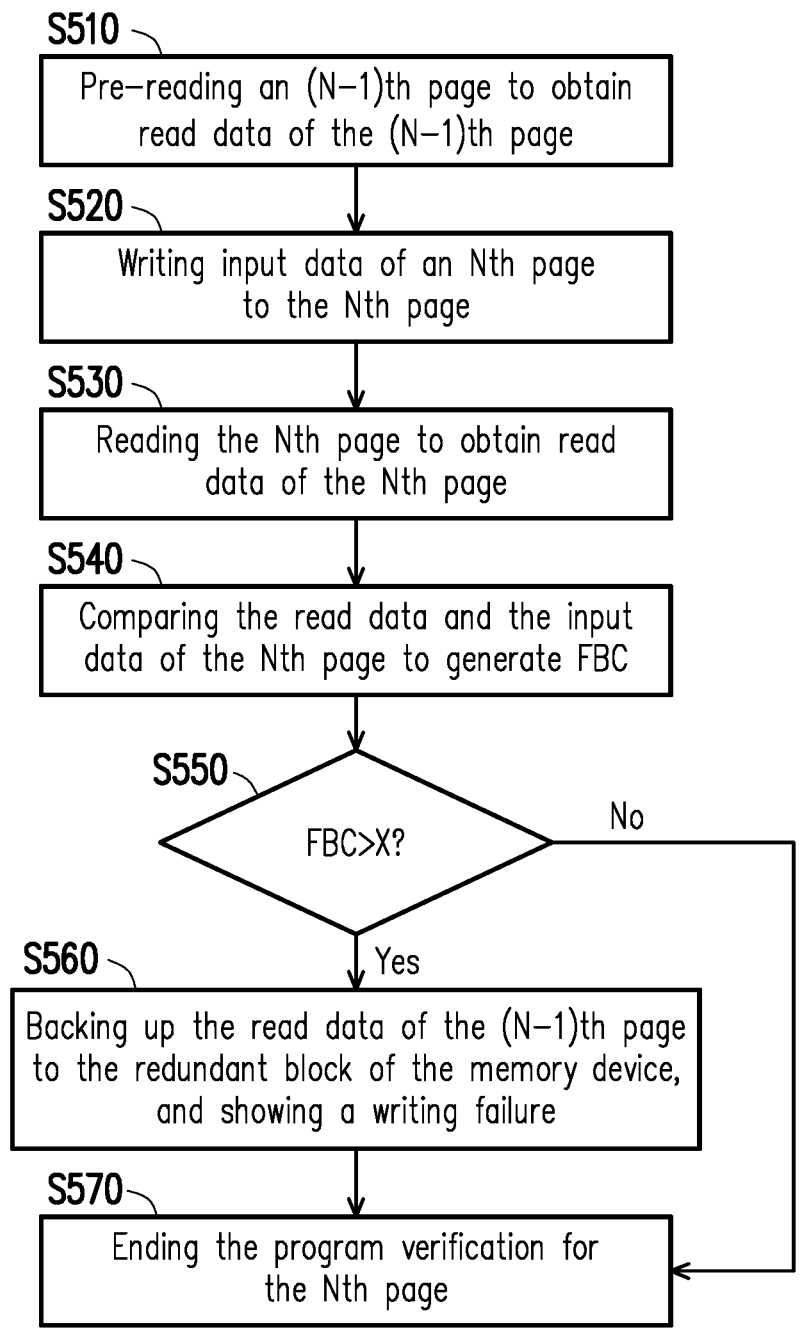
FIG. 5 is a flowchart illustrating a program verification method according to another embodiment of the invention.

FIG. 5 is a flowchart illustrating a program verification method according to another embodiment of the invention. With reference to FIG. 5, steps S510 to step S550 can refer to the related description for FIG. 4. In step S560, the controller backs up the read data of the (N−1)th page to the redundant block of the memory device, and a writing failure is shown. Next, in step S570, the program verification for the Nth page is ended. In this embodiment, the controller compares the input data with the read data of the Nth page to determine whether to back up the data of the (N−1)th page before writing the Nth page.

Figure 6:
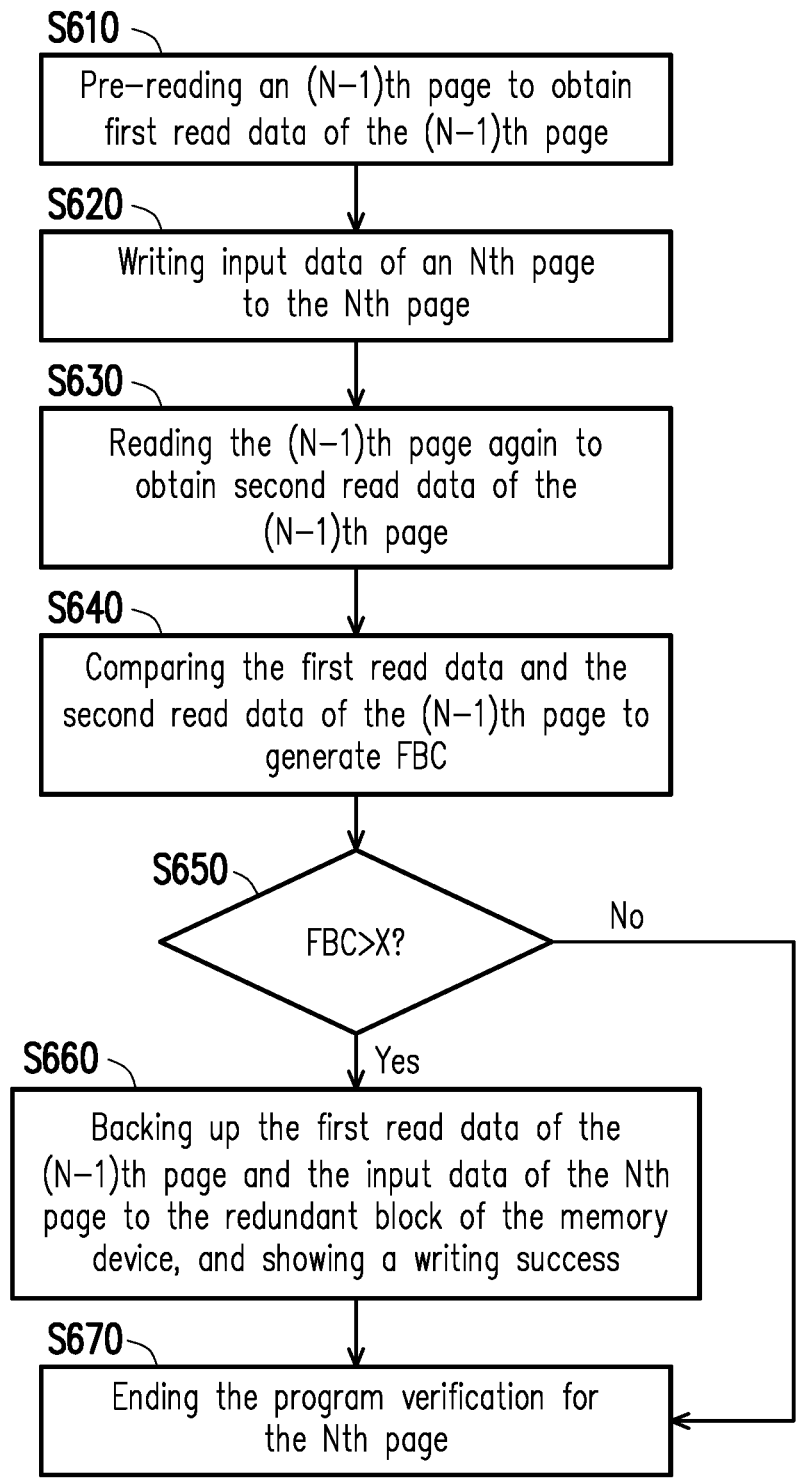
FIG. 6 is a flowchart illustrating a program verification method according to another embodiment of the invention.

FIG. 6 is a flowchart illustrating a program verification method according to another embodiment of the invention. With reference to FIG. 6, before writing an Nth page, in step S610, the controller pre-reads data of an (N−1)th page to obtain first read data of the (N−1)th page. Next, in step S620, the controller writes input data of the Nth page to the Nth page. After writing the Nth page, in step S630, the controller re-reads the (N−1)th page to obtain second read data of the (N−1)th page.

In step S640, the controller compares the first read data and the second read data of the (N−1)th page to generate a failure bit count FBC. Specifically, in an embodiment, the controller can include a counter. The controller determines whether read data of the (N−1)th page before the write operation for the Nth page (the first read data) and read data of the (N−1)th page after the write operation for the Nth page (the second read data) are equal by comparing the first read data and the second read data of the (N−1)th page, and uses the counter to calculate the failure bit count FBC of the (N−1)th page. For instance, each time when the controller determines that bit data in the first read data and the second read data are different, the counter adds one to the failure bit count FBC. Each time when the controller determines that the bit data in the first read data and the second read data are identical, the failure bit count FBC remains unchanged. Accordingly, when data of all bits in the first read data and the second read data are compared, the comparison for the read data of the (N−1)th page is ended, and the failure bit count FBC of the (N−1)th page is obtained. It is worth noting that, when the controller determines that the bit data in the first read data and the second read data are different, it means that the write operation for the Nth page already causes the defects located on the memory cells of the (N−1)th page or between the word lines so that the read data of the (N−1)th page is incorrect.

In step S650, the controller determines whether to back up the first read data of the (N−1)th page and the input data of the Nth page to the redundant block of the memory device according to the failure bit count FBC. When the failure bit count FBC is less than or equal to a preset threshold X, the controller does not back up the first read data of (N−1)th page and the input data of the Nth page and step S670 is executed. When the failure bit count FBC is greater than the preset threshold X, step S660 is executed. Here, the preset threshold X is a preset value based on design requirements, and the invention does not limit a size of the preset threshold X. In step S660, the controller backs up the first read data of the (N−1)th page and the input data of the Nth page to the redundant block of the memory device, and a writing success is shown. Next, in step S670, the program verification for the Nth page is ended. In this embodiment, the controller compares the read data of the (N−1)th page before and after writing the Nth page to determine whether to back up the data of the (N−1)th page and the Nth page before writing the Nth page.

Figure 7:
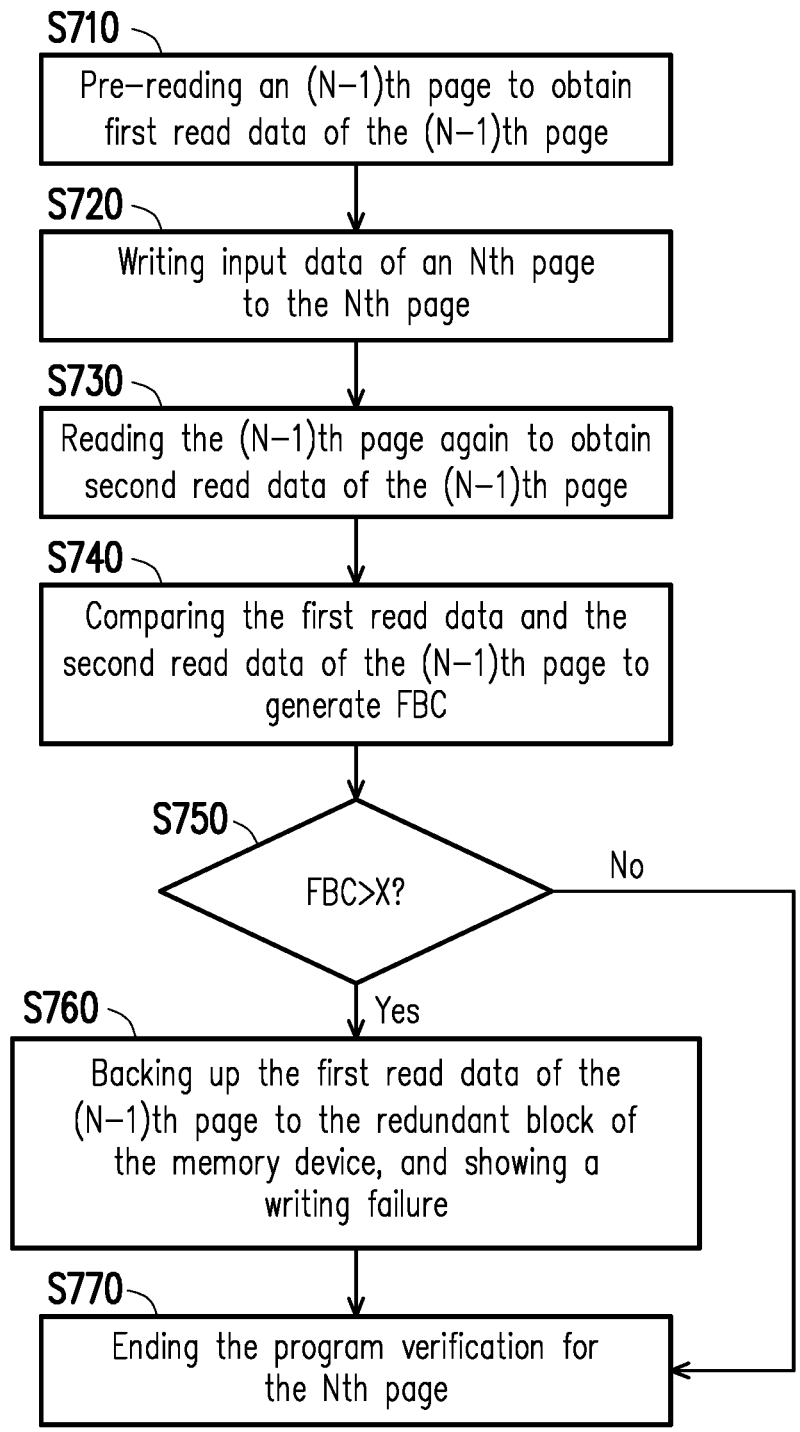
FIG. 7 is a flowchart illustrating a program verification method according to another embodiment of the invention.

FIG. 7 is a flowchart illustrating a program verification method according to another embodiment of the invention. With reference to FIG. 7, steps S710 to step S750 can refer to the related description for FIG. 6. In step S760, the controller backs up the first read data of the (N−1)th page to the redundant block of the memory device, and a writing failure is shown. Next, in step S770, the program verification for the Nth page is ended. In this embodiment, the controller compares the read data of the (N−1)th page before and after writing the Nth page to determine whether to back up the data of the (N−1)th page before writing the Nth page.

Figure 8:
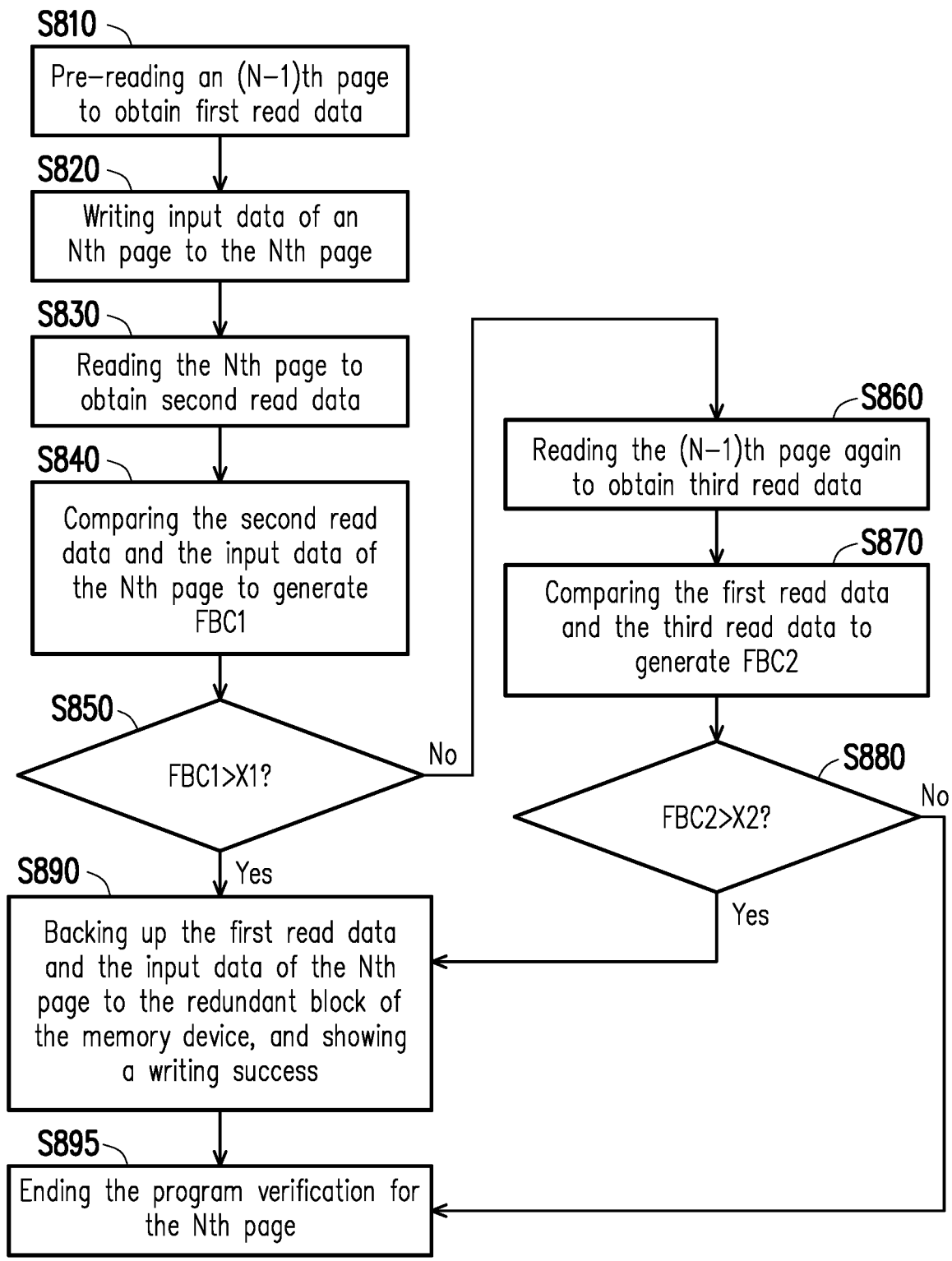
FIG. 8 is a flowchart illustrating a program verification method according to another embodiment of the invention.

FIG. 8 is a flowchart illustrating a program verification method according to another embodiment of the invention. With reference to FIG. 8, before writing an Nth page, in step S810, the controller pre-reads data of an (N−1)th page to obtain first read data. Next, in step S820, the controller writes input data of the Nth page to the Nth page. After writing the Nth page, in step S830, the controller reads the Nth page to obtain second read data.

In step S840, the controller compares the second read data and the input data of the Nth page to generate a first failure bit count FBC1. Specifically, in an embodiment, the controller can include a counter. The controller determines whether the read data and the input data of the Nth page are equal by comparing the read data and the input data of the Nth page and uses the counter to calculate the first failure bit count FBC1 of the Nth page. For instance, each time when the controller determines that bit data in the second read data and the input data of the Nth page are different, the counter adds one to the first failure bit count FBC1. Each time when the controller determines that the bit data in the second read data and the input data of the Nth page are identical, the first failure bit count FBC1 remains unchanged. Accordingly, when data of all bits in the second read data and the input data of the Nth page are compared, a verification for the read data of the Nth page is ended and the first failure bit count FBC1 is obtained. It should be noted that, when the controller determines that the bit data in the second read data and the input data of the Nth page are different, it means that a write operation for the Nth page already causes the defects located on the memory cells of the Nth page or between the word lines so that the read data of the Nth page is incorrect.

In step S850, the controller determines whether to back up the read data of the (N−1)th page and the input data of the Nth page to the redundant block of the memory device according to the first failure bit count FBC1. When the first failure bit count FBC1 is greater than a first preset threshold X1, step S890 is executed. When the first failure bit count FBC1 is less than or equal to the first preset threshold X1, step S860 is executed. Here, the first preset threshold X1 is a preset value based on design requirements, and the invention does not limit a size of the first preset threshold X1.

In step S860, the controller re-reads the (N−1)th page to obtain third read data. Next, in step S870, the controller compares the first read data and the third read data to generate a second failure bit count FBC2. Specifically, in an embodiment, the controller can include a counter. The controller determines whether read data of the (N−1)th page before the write operation for the Nth page (the first read data) and read data of the (N−1)th page after the write operation for the Nth page (the third read data) are equal by comparing the first read data and the third read data, and uses the counter to calculate the second failure bit count FBC2. For instance, each time when the controller determines that bit data in the first read data and the third read data are different, the counter adds one to the second failure bit count FBC2. Each time when the controller determines that the bit data in the first read data and the third read data are identical, the second failure bit count FBC2 remains unchanged. Accordingly, when data of all bits in the first read data and the third read data are compared, the comparison for the read data of the (N−1)th page is ended, and the second failure bit count FBC2 is obtained. It is worth noting that, when the controller determines that the bit data in the first read data and the third data are different, it means that the write operation for the Nth page already causes the defects located on the memory cells of the (N−1)th page or between the word lines so that the read data of the (N−1)th page is incorrect.

In step S880, the controller determines whether to back up the first read data of the (N−1)th page and the input data of the Nth page to the redundant block of the memory device according to the second failure bit count FBC2. When the second failure bit count FBC2 is less than or equal to a second preset threshold X2, the controller does not back up the first read data of the (N−1)th page and the input data of the Nth page and step S895 is executed. When the second failure bit count FBC2 is greater than the second preset threshold X2, step S890 is executed. Here, the second preset threshold X2 is a preset value based on design requirements, and the invention does not limit a size of the second preset threshold X2. In step S890, the controller backs up the first read data of the (N−1)th page and the input data of the Nth page to the redundant block of the memory device, and a writing success is shown. Next, in step S895, the program verification for the Nth page is ended. In this embodiment, the controller first compares the input data with the read data of the Nth page and then compares the read data of the (N−1)th page before and after writing the Nth page to determine whether to back up the data of the (N−1)th page and the Nth page before writing the Nth page.

Figure 9:
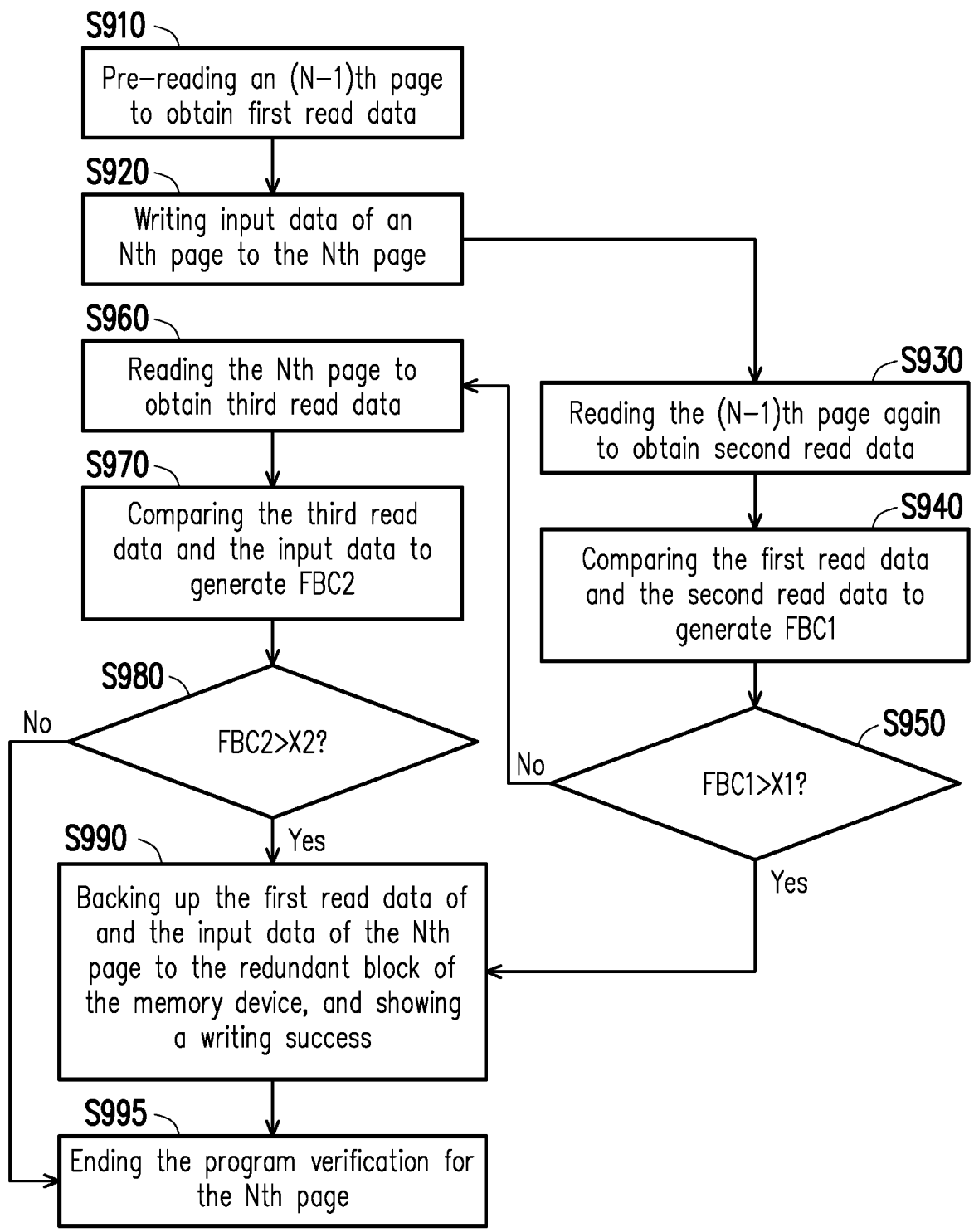
FIG. 9 is a flowchart illustrating a program verification method according to another embodiment of the invention.

FIG. 9 is a flowchart illustrating a program verification method according to another embodiment of the invention. With reference to FIG. 9, before writing an Nth page, in step S910, the controller pre-reads data of an (N−1)th page to obtain first read data of the (N−1)th page. Next, in step S920, the controller writes input data of the Nth page to the Nth page. After writing the Nth page, in step S930, the controller re-reads the (N−1)th page to obtain second read data of the (N−1)th page.

In step S940, the controller compares the first read data and the second read data of the (N−1)th page to generate a first failure bit count FBC1. Specifically, in an embodiment, the controller can include a counter. The controller determines whether read data of the (N−1)th page before the write operation for the Nth page (the first read data) and read data of the (N−1)th page after the write operation for the Nth page (the second read data) are equal by comparing the first read data and the second read data of the (N−1)th page, and uses the counter to calculate the first failure bit count FBC1 of the (N−1)th page. For instance, each time when the controller determines that bit data in the first read data and the second read data are different, the counter adds one to the first failure bit count FBC1. Each time when the controller determines that the bit data in the first read data and the second read data are identical, the first failure bit count FBC1 remains unchanged. Accordingly, when data of all bits in the first read data and the second read data are compared, the comparison for the read data of the (N−1)th page is ended, and the first failure bit count FBC1 of the (N−1)th page is obtained. It is worth noting that, when the controller determines that the bit data in the first read data and the second read data are different, it means that the write operation for the Nth page already causes the defects located on the memory cells of the (N−1)th page or between the word lines so that the read data of the (N−1)th page is incorrect.

In step S950, the controller determines whether to back up the first read data of the (N−1)th page and the input data of the Nth page to the redundant block of the memory device according to the first failure bit count FBC1. When the first failure bit count FBC1 is less than or equal to a preset threshold X1, step S960 is executed. When the first failure bit count FBC1 is greater than the preset threshold X1, step S990 is executed. Here, the first preset threshold X1 is a preset value based on design requirements, and the invention does not limit a size of the first preset threshold X1.

In step S960, the controller re-reads the Nth page to obtain third read data. Next, in step S970, the controller compares the third read data and the input data of the Nth page to generate a second failure bit count FBC2. Specifically, in an embodiment, the controller can include a counter. The controller determines whether the third read data and the input data of the Nth page are equal by comparing the third read data and the input data of the Nth page and uses the counter to calculate the second failure bit count FBC2 of the Nth page. For instance, each time when the controller determines that bit data in the third read data and the input data of the Nth page are different, the counter adds one to the second failure bit count FBC2. Each time when the controller determines that the bit data in the third read data and the input data of the Nth page are identical, the second failure bit count FBC2 remains unchanged. Accordingly, when data of all bits in the third read data and the input data of the Nth page are compared, a verification for the read data of the Nth page is ended and the second failure bit count FBC2 is obtained. It should be noted that, when the controller determines that the bit data in the third read data and the input data of the Nth page are different, it means that a write operation for the Nth page already causes the defects located on the memory cells of the Nth page or between the word lines so that the read data of the Nth page is incorrect.

In step S980, the controller determines whether to back up the first read data of the (N−1)th page and the input data of the Nth page to the redundant block of the memory device according to the second failure bit count FBC2. When the second failure bit count FBC2 is less than or equal to a second preset threshold X2, the controller does not back up the first read data of (N−1)th page and the input data of the Nth page and step S995 is executed. When the second failure bit count FBC2 is greater than the second preset threshold X2, step S990 is executed. Here, the second preset threshold X2 is a preset value based on design requirements, and the invention does not limit a size of the second preset threshold X2. In step S990, the controller backs up the first read data of the (N−1)th page and the input data of the Nth page to the redundant block of the memory device, and a writing success is shown. Next, in step S995, the program verification for the Nth page is ended. In this embodiment, the controller first compares the read data of the (N−1)th page before and after writing the Nth page and then compares the input data with the read data of the Nth page to determine whether to back up the data of the (N−1)th page and the Nth page before writing the Nth page.

Figure 10:
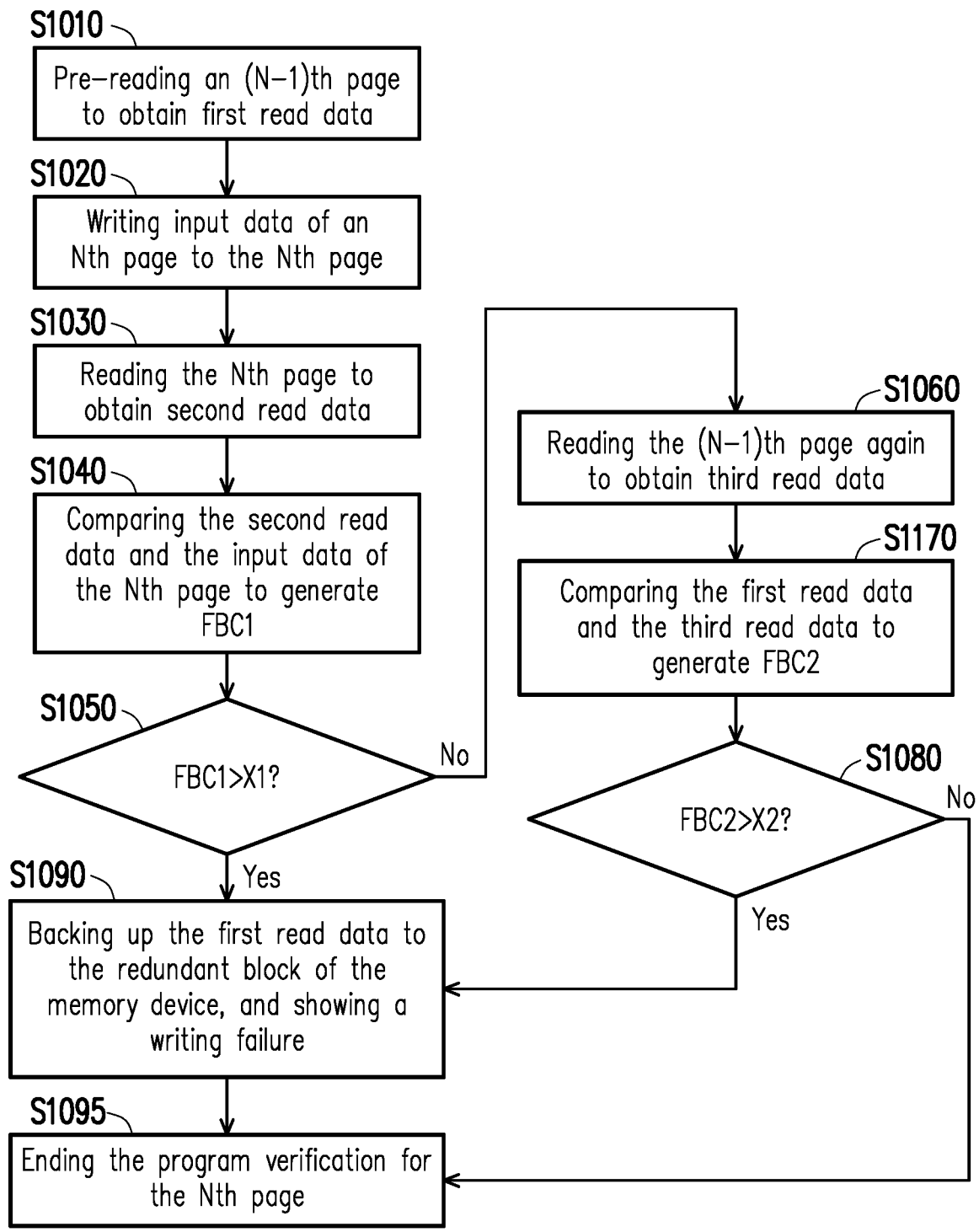
FIG. 10 is a flowchart illustrating a program verification method according to another embodiment of the invention.

FIG. 10 is a flowchart illustrating a program verification method according to another embodiment of the invention. With reference to FIG. 10, steps S1010 to step S1080 can refer to the related description for FIG. 8. In step S1090, the controller backs up the first read data of the (N−1)th page to the redundant block of the memory device, and a writing failure is shown. Next, in step S1095, the program verification for the Nth page is ended. In this embodiment, the controller first compares the input data with the read data of the Nth page and then compares the read data of the (N−1)th page before and after writing the Nth page to determine whether to back up the data of the (N−1)th page before writing the Nth page.

Figure 11:
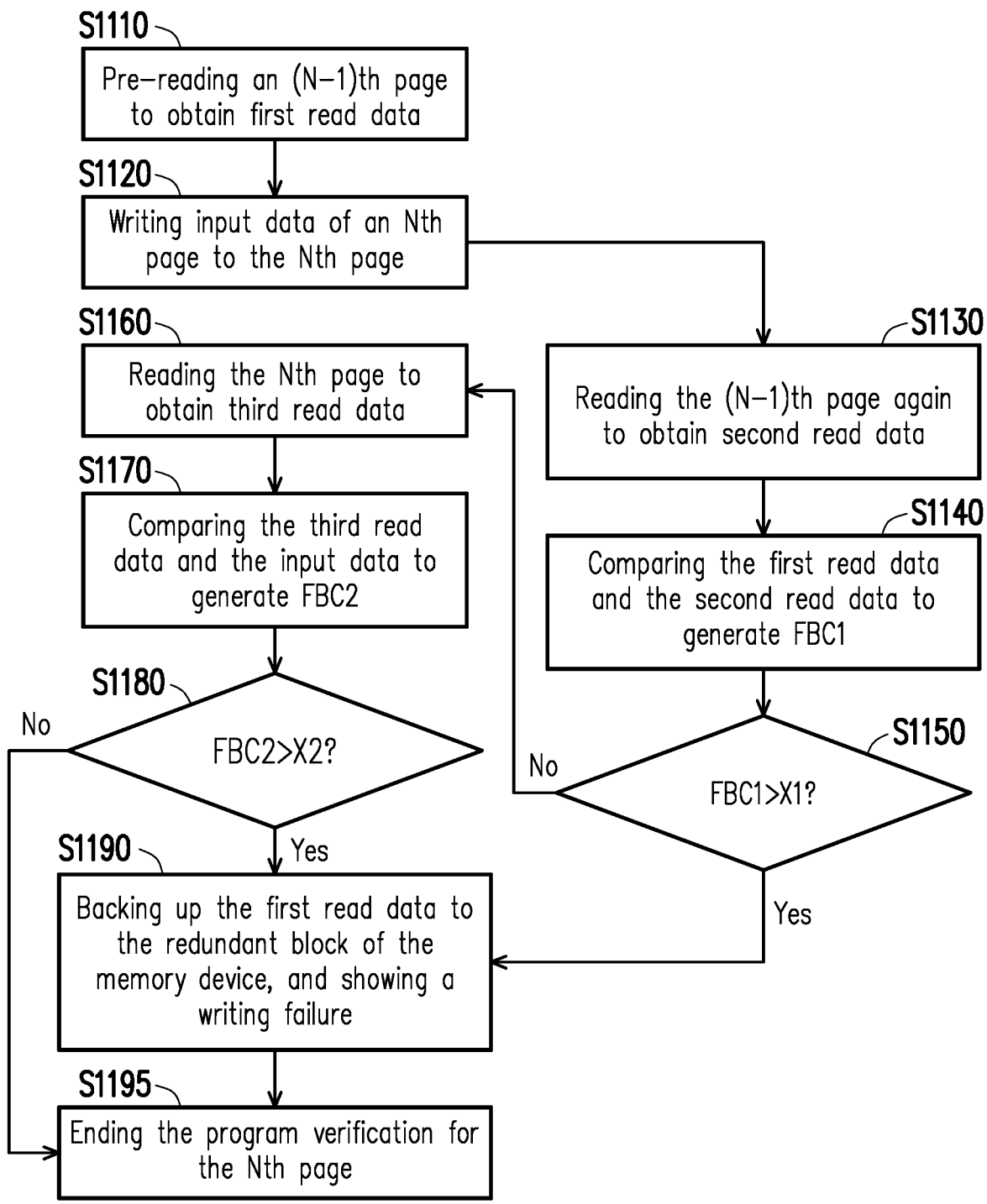
FIG. 11 is a flowchart illustrating a program verification method according to another embodiment of the invention.

FIG. 11 is a flowchart illustrating a program verification method according to another embodiment of the invention. With reference to FIG. 11, steps S1110 to step S1180 can refer to the related description for FIG. 9. In step S1190, the controller backs up the first read data of the (N−1)th page to the redundant block of the memory device, and a writing failure is shown. Next, in step S1195, the program verification for the Nth page is ended. In this embodiment, the controller first compares the read data of the (N−1)th page before and after writing the Nth page and then compares the input data with the read data of the Nth page to determine whether to back up the data of the (N−1)th page before writing the Nth page.

In summary, according to the embodiments of the invention, the memory device and the program verification method thereof can improve quality and reliability of the memory device. By pre-reading the previous page before writing the current page, and reading and analyzing at least one of the previous page and the current page after writing the current page, whether to back up the data to the redundant block of the memory device can be determined so that the process defects can be detected in the program verification. It leads to a significant reduction of failure rate of the memory device. Moreover, the one-shot writing and backup for the redundant block can reduce the program verification time overall.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A program verification method adapted for a memory device, the program verification method comprising:
    reading a previous page to obtain a first read data;
    writing input data to a current page;
    reading the previous page or the current page to obtain a second read data; and
    analyzing at least one of the first read data and the second read data to determine whether to back up at least one of the first read data and the input data to a redundant block of the memory device.

2. The program verification method according to claim 1, further comprising:
    analyzing the second read data to determine whether to back up at least one of the first read data and the input data to the redundant block,
    wherein the step of analyzing the second read data to determine whether to back up at least one of the first read data and the input data to the redundant block comprises:
    comparing the second read data and the input data to generate a failure bit count; and
    determining whether to back up at least one of the first read data and the input data to the redundant block according to the failure bit count.

3. The program verification method according to claim 2, wherein the step of determining whether to back up at least one of the first read data and the input data to the redundant block according to the failure bit count comprises:
    when the failure bit count is greater than the preset threshold, backing up at least one of the first read data and the input data to the redundant block.

4. The program verification method according to claim 1, further comprising:
    analyzing the first read data and the second read data to determine whether to back up at least one of the first read data and the input data to the redundant block,
    wherein the step of analyzing the first read data and the second read data to determine whether to back up at least one of the first read data and the input data to the redundant block comprises:
    comparing the first read data and the second read data to obtain a failure bit count; and
    determining whether to back up at least one of the first read data and the input data to the redundant block according to the failure bit count.

5. The program verification method according to claim 4, wherein the step of determining whether to back up at least one of the first read data and the input data to the redundant block according to the failure bit count comprises:
    when the failure bit count is greater than the preset threshold, backing up at least one of the first read data and the input data to the redundant block.

6. The program verification method according to claim 1, further comprising:
    reading the current page to obtain the second read data; and
    analyzing the second read data to determine whether to back up at least one of the first read data and the input data to the redundant block,
    wherein the step of analyzing the second read data to determine whether to back up at least one of the first read data and the input data to the redundant block comprises:
    comparing the second read data and the input data to obtain a first failure bit count; and
    determining whether to back up at least one of the first read data and the input data to the redundant block according to the first failure bit count,
    when the first failure bit count is greater than a first preset threshold, backing up at least one of the first read data and the input data to the redundant block; and
    when the first failure bit count is less than or equal to the first preset threshold,
        reading the previous page to obtain third read data;
        comparing the first read data and the third read data to obtain a second failure bit count; and
        determining whether to back up at least one of the first read data and the input data to the redundant block according to the second failure bit count.

7. The program verification method according to claim 6, wherein the step of determining whether to back up at least one of the first read data and the input data to the redundant block according to the second failure bit count comprises:
    when the second failure bit count is greater than a second preset threshold, backing up at least one of the first read data and the input data to the redundant block.

8. The program verification method according to claim 1, further comprising:
    reading the previous page to obtain the second read data; and
    analyzing the second read data to determine whether to back up at least one of the first read data and the input data to the redundant block,
    wherein the step of analyzing the second read data to determine whether to back up at least one of the first read data and the input data to the redundant block comprises:
    comparing the first read data and the second read data to obtain a first failure bit count; and
    determining whether to back up at least one of the first read data and the input data to the redundant block according to the first failure bit count,
    when the first failure bit count is greater than a first preset threshold, backing up at least one of the first read data and the input data to the redundant block; and
    when the first failure bit count is less than or equal to the first preset threshold,
        reading the current page to obtain third read data;
        comparing the third read data and the input data to obtain a second failure bit count; and
        determining whether to back up at least one of the first read data and the input data to the redundant block according to the second failure bit count.

9. The program verification method according to claim 8, wherein the step of determining whether to back up at least one of the first read data and the input data to the redundant block according to the second failure bit count comprises:
    when the second failure bit count is greater than a second preset threshold, backing up at least one of the first read data and the input data to the redundant block.

10. The program verification method according to claim 8, wherein the step of determining whether to back up at least one of the first read data and the input data to the redundant block according to the second failure bit count comprises:

when the second failure bit count is greater than a second preset threshold, backing up at least one of the first read data and the input data to the redundant block.

11. The program verification method according to claim 1, wherein when backing up at least one of the first read data and the input data to the redundant block, all word lines of the redundant block are turned on for performing a one-shot writing with determining whether to verify or not.

12. A memory device, comprising:
 a memory array, comprising a plurality of pages; and
 a controller, coupled to the memory array, the controller being configured as:
 reading a previous page to obtain a first read data;
 writing input data to a current page;
 reading at least one of the previous page and the current page to obtain a second read data; and
 analyzing at least one of the first read data and the second read data to determine whether to back up at least one of the first read data and the input data to a redundant block of the memory array.

13. The memory device according to claim 12, wherein the controller being further configured:
 analyzing the second read data to determine whether to back up at least one of the first read data and the input data to the redundant block,
 wherein the step of analyzing the second read data to determine whether to back up at least one of the first read data and the input data to the redundant block comprises:
 comparing the second read data and the input data to generate a failure bit count; and
 determining whether to back up at least one of the first read data and the input data to the redundant block according to the failure bit count.

14. The memory device according to claim 13, wherein the step of determining whether to back up at least one of the first read data and the input data to the redundant block according to the failure bit count comprises:
 when the failure bit count is greater than the preset threshold, backing up at least one of the first read data and the input data to the redundant block.

15. The memory device according to claim 12, wherein the controller being further configured:
 analyzing the first read data and the second read data to determine whether to back up at least one of the first read data and the input data to the redundant block,
 wherein the step of analyzing the first read data and the second read data to determine whether to back up at least one of the first read data and the input data to the redundant block comprises:
 comparing the first read data and the second read data to obtain a failure bit count; and
 determining whether to back up at least one of the first read data and the input data to the redundant block according to the failure bit count.

16. The memory device according to claim 15, wherein the step of determining whether to back up at least one of the first read data and the input data to the redundant block according to the failure bit count comprises:
 when the failure bit count is greater than the preset threshold, backing up at least one of the first read data and the input data to the redundant block.

17. The memory device according to claim 12, wherein the controller being further configured:
 reading the current page to obtain the second read data; and
 analyzing the second read data determine whether to back up at least one of the first read data and the input data to the redundant block,
 wherein the step of analyzing the second read data to determine whether to back up at least one of the first read data and the input data to the redundant block comprises:
 comparing the second read data and the input data to obtain a first failure bit count; and
 determining whether to back up at least one of the first read data and the input data to the redundant block according to the first failure bit count,
 when the first failure bit count is greater than a first preset threshold, backing up at least one of the first read data and the input data to the redundant block; and
 when the first failure bit count is less than or equal to the first preset threshold,
  reading the previous page to obtain third read data;
  comparing the first read data and the third read data to obtain a second failure bit count; and
  determining whether to back up at least one of the first read data and the input data to the redundant block according to the second failure bit count.

18. The memory device according to claim 11, wherein when backing up at least one of the first read data and the input data to the redundant block, the controller is further configured to turn on all word lines of the redundant block for performing a one-shot writing with determining whether to verify or not.

\* \* \* \* \*